United States Patent
Jian (10) Patent No.: US 10,874,029 B1
(45) Date of Patent: Dec. 22, 2020

(54) CAGE ASSEMBLY (71) Applicants: INVENTEC (PUDONG) TECHNOLOGY CORPORATION, Shanghai (CN); INVENTEC CORPORATION, Taipei (TW)

(72) Inventor: Hong-Jie Jian, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/714,162

(22) Filed: Dec. 13, 2019

(30) Foreign Application Priority Data

Sep. 5, 2019 (CN) .......................... 2019 1 0837685

(51) Int. Cl.
| | | |
|---|---|---|
| *H05K 7/02* | (2006.01) | |
| *H05K 7/04* | (2006.01) | |
| *H05K 7/20* | (2006.01) | |
| *G06F 1/18* | (2006.01) | |

(52) U.S. Cl.
CPC ......... *H05K 7/20145* (2013.01); *G06F 1/185* (2013.01)

(58) Field of Classification Search
USPC .................................................. 361/809, 810
See application file for complete search history.

(56) References Cited

U.S. PATENT DOCUMENTS

| | | | | |
|---|---|---|---|---|
| 5,513,329 A * | 4/1996 | Pecone | ................ | G06F 13/409 361/679.32 |
| 6,958,916 B2 * | 10/2005 | Roesner | ................ | G06F 1/184 361/728 |
| 7,381,081 B2 * | 6/2008 | Zhang | ................ | G06F 1/185 439/377 |
| 7,652,891 B2 * | 1/2010 | Lucero | ................ | G06F 1/20 361/752 |
| 8,537,557 B2 * | 9/2013 | Li | ................ | G06F 1/186 361/730 |
| 8,737,054 B2 * | 5/2014 | Zhou | ................ | G06F 1/185 361/679.32 |
| 8,804,343 B2 * | 8/2014 | Fan | ................ | G06F 1/186 361/737 |

* cited by examiner

*Primary Examiner* — Hung S. Bui
(74) *Attorney, Agent, or Firm* — Maschoff Brennan (57) ABSTRACT

The disclosure provides a cage assembly including a cage body and a baffle. The cage body includes a rear portion, a first plate portion, a second plate portion, and a third plate portion. The first plate portion, the second plate portion and the third plate portion are respectively connected to different sides of the rear portion. The third plate portion is located between and connected to the first plate portion and the second plate portion. The rear portion, the first plate portion, the second plate portion and the third plate portion together form an accommodation space therebetween for accommodating a riser card and an expansion card. The first plate portion includes a vent hole connected to the accommodation space. The baffle is configured to be pivoted with respect to the cage body so as to adjust an area of orthogonal projection of the baffle projected on the vent hole.

9 Claims, 9 Drawing Sheets

CAGE ASSEMBLY

CROSS-REFERENCE TO RELATED APPLICATIONS

This non-provisional application claims priority under 35 U.S.C. § 119(a) on Patent Application No(s). 201910837685.8 filed in China on Sep. 5, 2019 the entire contents of which are hereby incorporated by reference.

BACKGROUND OF THE INVENTION

Technical Field of the Invention

The disclosure relates to a cage, more particularly to a cage assembly with a baffle.

Description of the Related Art

In order to make an electronic device (e.g., a desktop computer, a laptop computer or a server) meet the requirement of usage, connecting one or more expansion cards to the mother board of the electronic device is a common way to increase the performance of the electronic device. The connection between the expansion card and the mother board is relied on a riser card.

In general, the riser card and the expansion card are fixed on a cage, and the baffle has a baffle for guiding airflow produced by a dissipation fan of the electronic device to flow towards the expansion card, such that heat generated by the expansion card can be taken away by the airflow.

SUMMARY OF THE INVENTION

One embodiment of the disclosure provides a cage assembly. The cage assembly is configured to accommodate a riser card and an expansion card mounted on the riser card. The cage assembly includes a cage body and a baffle. The cage body includes a rear portion, a first plate portion, a second plate portion, and a third plate portion. The first plate portion, the second plate portion and the third plate portion are respectively connected to different sides of the rear portion. The first plate portion and the second plate portion are respectively located at two opposite sides of the rear portion, and the third plate portion is located between and connected to the first plate portion and the second plate portion. The rear portion, the first plate portion, the second plate portion and the third plate portion together form an accommodation space therebetween, and the accommodation space is configured to accommodate the riser card and the expansion card. The first plate portion includes a vent hole connected to the accommodation space. The baffle is configured to be pivoted with respect to the cage body so as to adjust an area of orthogonal projection of the baffle projected on the vent hole.

BRIEF DESCRIPTION OF THE DRAWINGS

The present disclosure will become more fully understood from the detailed description given hereinbelow and the accompanying drawings which are given by way of illustration only and thus are not limitative to the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present disclosure is not limited thereto. Furthermore, for the purpose of illustration, some of the structures and components in the figures are simplified, and wires, reference lines or buses are omitted in some of the figures.

Moreover, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
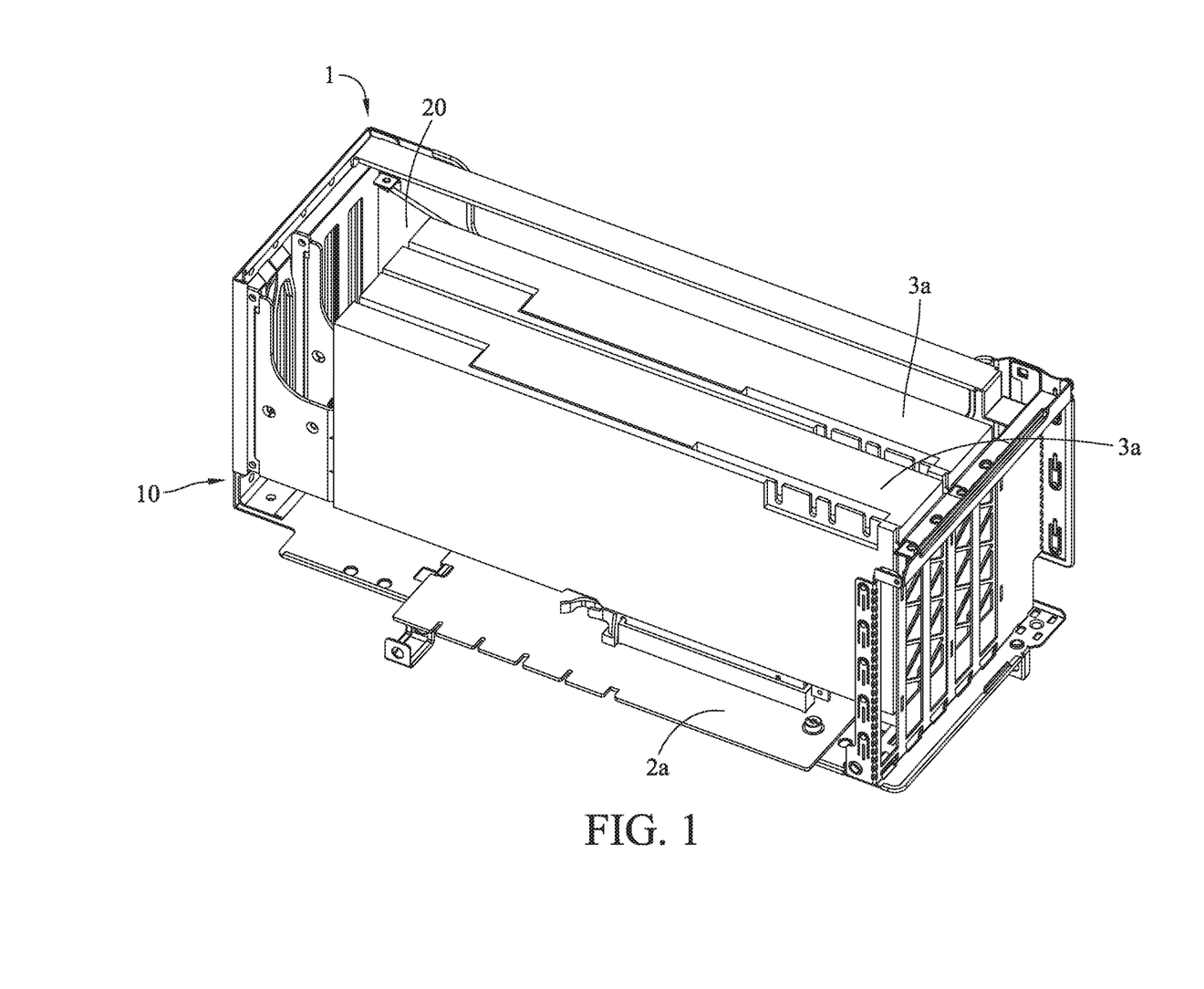
FIG. 1 is a perspective view of a cage assembly according to one embodiment of the disclosure with a riser card and expansion cards.
Figure 2:
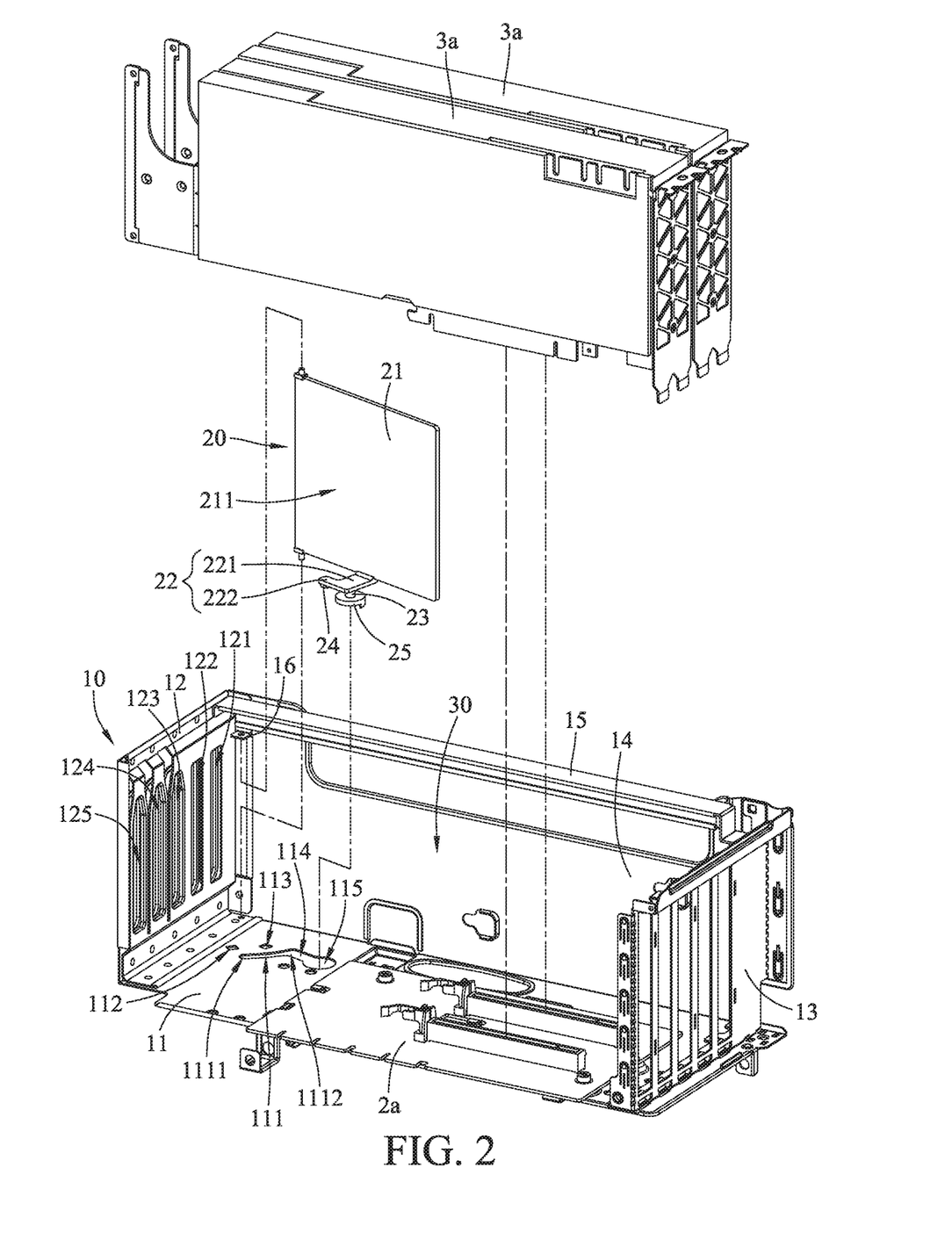
FIG. 2 is an exploded view of the cage assembly, the riser card, and the expansion cards in FIG. 1.

Referring to FIGS. 1 and 2, FIG. 1 is a perspective view of a cage assembly 1 according to one embodiment of the disclosure with a riser card 2a and expansion cards 3a, and FIG. 2 is an exploded view of the cage assembly 1, the riser card 2a, and the expansion cards 3a in FIG. 1.

In this embodiment, the cage assembly 1 is configured to accommodate a riser card 2a and one or more expansion cards 3a mounted on the riser card 2a. The riser card 2a is, for example, a Peripheral Component Interconnect Express (PCIe) card. The expansion card 3a is, for example, a graphic card, network interface card, sound card, or memory card.

The cage assembly 1 includes a cage body 10 and a baffle 20. The cage body 10 includes a rear portion 11, a first plate portion 12, a second plate portion 13, a third plate portion 14, a fourth plate portion 15, and a tab 16. The first plate portion 12, the second plate portion 13, and the third plate portion 14 are respectively connected to different sides of the rear portion 11. The first plate portion 12 and the second plate portion 13 are respectively located at two opposite sides of the rear portion 11, and the third plate portion 14 is located between and connected to the first plate portion 12 and the second plate portion 13. The fourth plate portion 15 is located between and connected to the first plate portion 12 and the second plate portion 13. The fourth plate portion 15 is located close to the third plate portion 14 and located above the rear portion 11. The tab 16 protrudes from the third plate portion 14. The tab 16 is located between the fourth plate portion 15 and the rear portion 11 and is located close to where the third plate portion 14 connects with the first plate portion 12.

The rear portion 11, the first plate portion 12, the second plate portion 13, and the third plate portion 14 together form an accommodation space 30 therebetween. The accommodation space 30 is sized to accommodate the riser card 2a and one or more expansion cards 3a. The first plate portion 12 of the cage body 10 includes five vent holes 121, 122, 123, 124, and 125. These vent holes 121, 122, 123, 124 and 125 are connected to the accommodation space 30, and the vent hole 121, 122, 123, 124 and 125 are arranged from a side of the first plate portion 12 connecting to the third plate portion 14 to another side of the first plate portion 12 away from the third plate portion 14. To dissipate heat generated by the expansion cards 3a, there may be a fan located nearby the cage assembly 1 to blow air into the accommodation space 30 via the vent hole 121, 122, 123, 124 and 125. The baffle 20 includes a plate portion 21. The plate portion 21 is located in the accommodation space 30, and two opposite sides of the plate portion 21 are respectively and pivotably disposed on the tab 16 and the rear portion 11.

Note that the configuration of the cage body may be modified according to actual requirements: In one embodiment, the tab 16 may be connected to the first plate portion 12; in another embodiment, the cage body may not include the tab 16, and the baffle 20 may be pivotably disposed on the fourth plate portion 15; in yet another embodiment, the cage body may not include the fourth plate portion 15.

Figure 3:
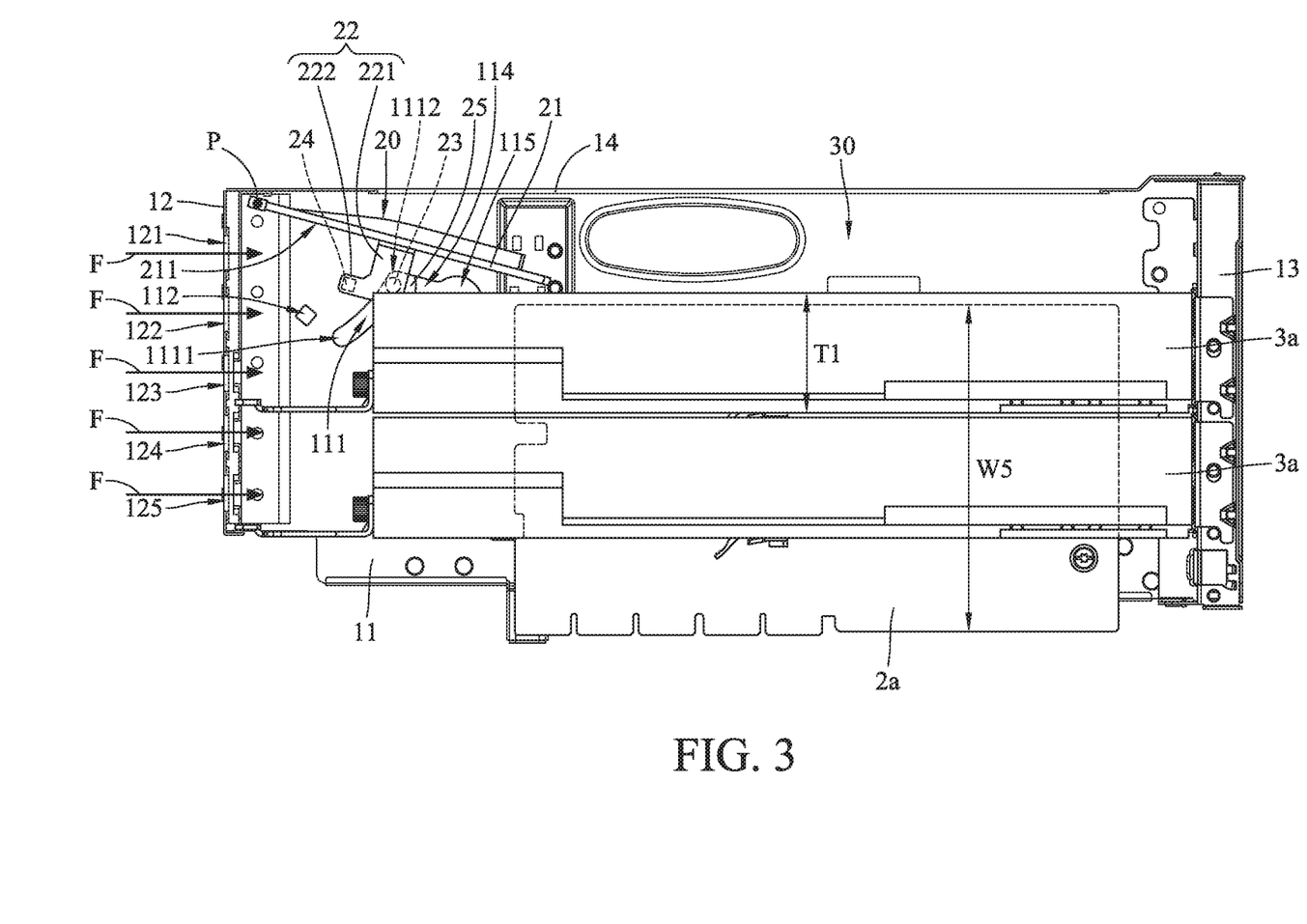
FIG. 3 is a top view of the cage assembly, the riser card, and the expansion cards in FIG. 1.
Figure 4:
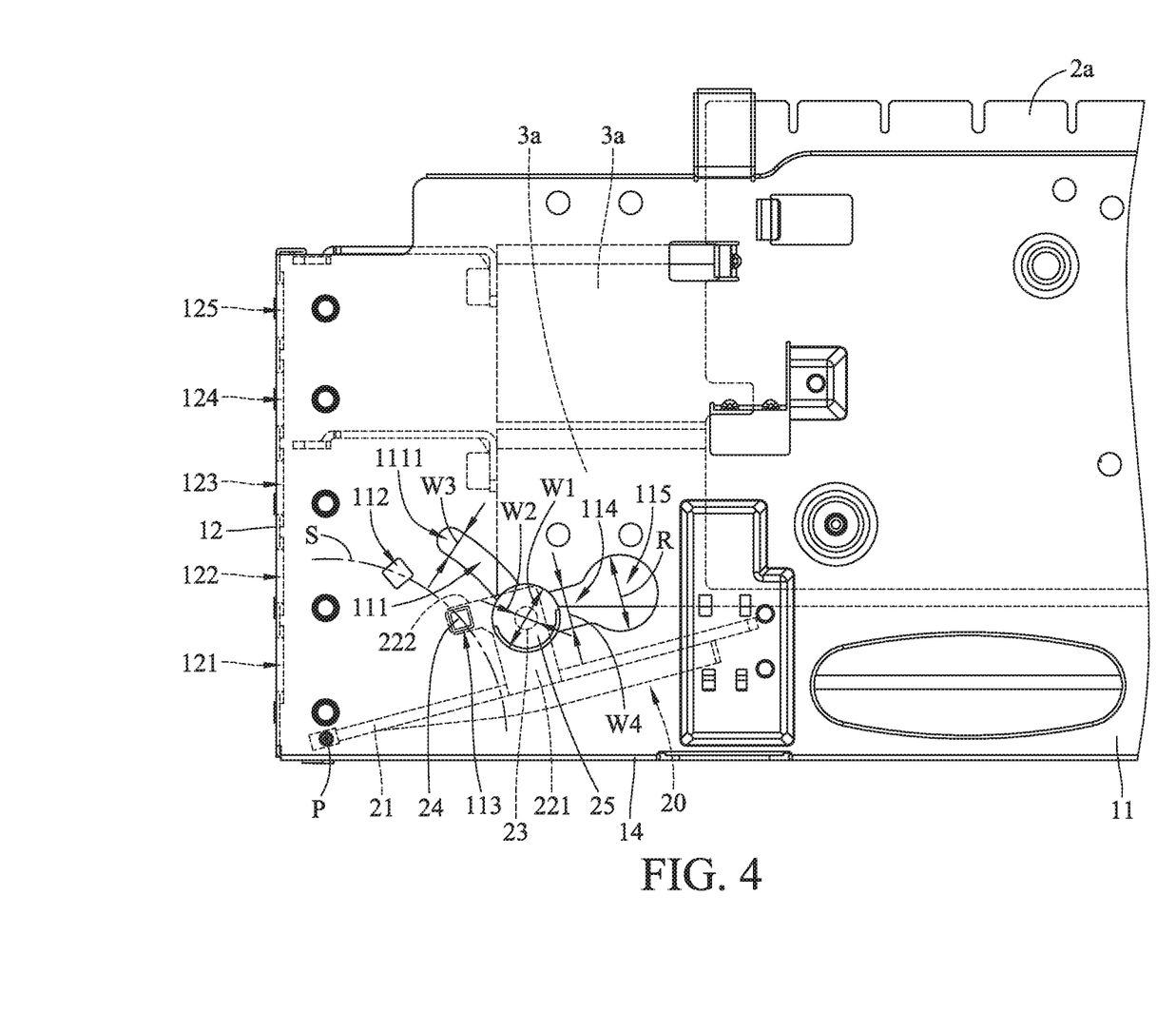
FIG. 4 is a partial enlarged bottom view of the cage assembly, the riser card, and the expansion cards in FIG. 1.

Then, referring to FIGS. 2 to 4. FIG. 3 is a top view of the cage assembly 1, the riser card 2a, and the expansion cards 3a in FIG. 1, and FIG. 4 is a partial enlarged bottom view of the cage assembly 1, the riser card 2a, and the expansion cards 3a in FIG. 1.

The rear portion 11 of the cage body 10 includes a guide hole 111 and two positioning holes 112 and 113. The guide hole 111 is, for example, a curved hole. The guide hole 111 includes two opposite ends: a first end 1111 and a second end 1112. The first end 1111 of the guide hole 111 is located closer to the first plate portion 12 than the second end 1112 of the guide hole 111, and the second end 1112 of the guide hole 111 is located closer to the third plate portion 14 than the first end 1111 of the guide hole 111. The positioning holes 112 and 113 are arranged along a curve line S whose center is at an axis P of the plate portion 21 of the baffle 20. The positioning holes 112 and 113 are located closer to the axis P of the plate portion 21 of the baffle 20 than the guide hole 111. The positioning hole 112 is located closer to the first end 1111 of the guide hole 111 than the positioning hole 113, and the positioning hole 113 is located closer to the second end 1112 of the guide hole 111 than the positioning hole 112.

Note that the arrangement of the guide hole and the positioning holes may be modified according to actual requirements. In one embodiment, the positioning holes 112 and 113 may be located further away from the axis P of the plate portion 21 of the baffle 20 than the guide hole 111.

The plate portion 21 of the baffle 20 includes a flow-guiding surface 211. The baffle 20 further includes an elastic extension portion 22, a neck portion 23, an engaging portion 24, and an operative portion 25. The elastic extension portion 22 is a flat structure including a first extension plate 221 and a second extension plate 222. The first extension plate 221 is connected to a side of the plate portion 21 close to the rear portion 11 and extends along a normal line of the flow-guiding surface 211. The second extension plate 222 is connected to the plate portion 21 via the first extension plate 221 and extends along a direction perpendicular to the normal line of the flow-guiding surface 211. The neck portion 23 is connected to a surface of the first extension plate 221 facing to the rear portion 11. The engaging portion 24 is connected to a surface of the second extension plate 222 facing to the rear portion 11. A distance between the engaging portion 24 and the axis P of the plate portion 21 is different from a distance between the neck portion 23 and the axis P of the plate portion 21. In detail, the engaging portion 24 is located closer to the axis P of the plate portion 21 than the neck portion 23, the neck portion 23 is movably located at the second end 1112 of the guide hole 111, and the engaging portion 24 is movable along the curve line S and is detachably engaged with the positioning hole 113. The operative portion 25 is located at a side of the rear portion 11 facing away from the accommodation space 30, and the operative portion 25 is connected to the first extension plate 221 via the neck portion 23. As such, when the operative portion 25 is forced to move towards the rear portion 11, and the movement of the operative portion 25 can force the elastic extension portion 22 to deform so as to enable the insertion and removal of the engaging portion 24 to the positioning hole 113. In this embodiment, a width W1 of the operative portion 25 is larger than a width W2 of the neck portion 23 and a width W3 of the guide hole 111, but the present disclosure is not limited thereto; in some other embodiments, the width of the operative portion of the baffle may be equal to or smaller than the width of the neck portion and the width of the guide hole.

In this embodiment, the plate portion 21, the elastic extension portion 22, the neck portion 23, the engaging portion 24 and the operative portion of the baffle 20 are made of a single piece, but the disclosure is not limited thereto. In addition, the rear portion 11 of the cage body 10 further includes a connecting hole 114 and an insertion hole 115. The insertion hole 115 is connected to the second end 1112 of the guide hole 111 via the connecting hole 114. The connecting hole 114 and the insertion hole 115 are located farther away from the axis P of the plate portion 21 of the baffle 20 than the guide hole 111. A width R of the insertion hole 115 is larger than a width W4 of the connecting hole 114 and the width W3 of the guide hole 111. The width W1 of the operative portion 25 is smaller than the width R of the insertion hole 115 and larger than the width W4 of the connecting hole 114. The width W2 of the neck portion 23 is smaller than the width W4 of the connecting hole 114.

Then, the installation process of the baffle 20 will be introduced hereinafter. Firstly, the baffle 20 can be placed into the accommodation space 30, and the operative portion 25 of the baffle 20 can be inserted through the insertion hole 115, such that the plate portion 21 is located in the accommodation space 30 and the operative portion 25 is located at the side of the rear portion 11 facing away from the accommodation space 30. Then, the neck portion 23 of the baffle 20 is moved to the second end 1112 of the guide hole 111 through the connecting hole 114, and the two opposite sides of the plate portion 21 of the baffle 20 can be pivotably installed to the tab 16 and the rear portion 11. Meanwhile, the engaging portion 24 of the baffle 20 can be engaged into the positioning hole 113. As such, the installation process of the baffle 20 on the cage body 10 is finished.

Note that the rear portion 11 of the cage body 10 may not have the connecting hole 114 and the insertion hole 115; in such a case, the operative portion is removably disposed on the neck portion to enable the installation of the baffle.

In addition, the connecting hole 114 is not restricted to be connected to the second end 1112 of the guide hole 111; in some other embodiment, the connecting hole 114 may be connected to the first end 1111 of the guide hole 111 or any other suitable part of the guide hole 111.

As shown in FIGS. 3 and 4, when the riser card 2a is accommodated in the accommodation space 30 and the expansion cards 3a are mounted on the riser card 2a, the vent holes 122, 123, 124 and 125 correspond to the expansion cards 3a, and the vent hole 121 corresponds to the flow-guiding surface 211 of the plate portion 21 of the baffle 20. In such an arrangement, the airflow F coming from the outside or produced by the fan (not shown) is allowed to enter into the accommodation space 30 via the vent holes 121, 121, 122, 123, 124 and 125. As shown, the airflow F passing through the vent holes 122, 123, 124 and 125 may directly flow towards the expansion card 3a, and the airflow F passing through the vent hole 121 may flow towards the flow-guiding surface 211 of the plate portion 21 and be guided to the expansion cards 3a. As such, the airflow F entering into the accommodation space 30 can be guided towards the area for the expansion cards 3a so as to achieve effective use of the airflow F for dissipating heat generated by the expansion cards 3a. Consequently, the baffle 20 prevents the airflow F from directly flowing towards the second plate portion 13 and losing, thus the required heat dissipation efficiency is ensured.

Figure 5:
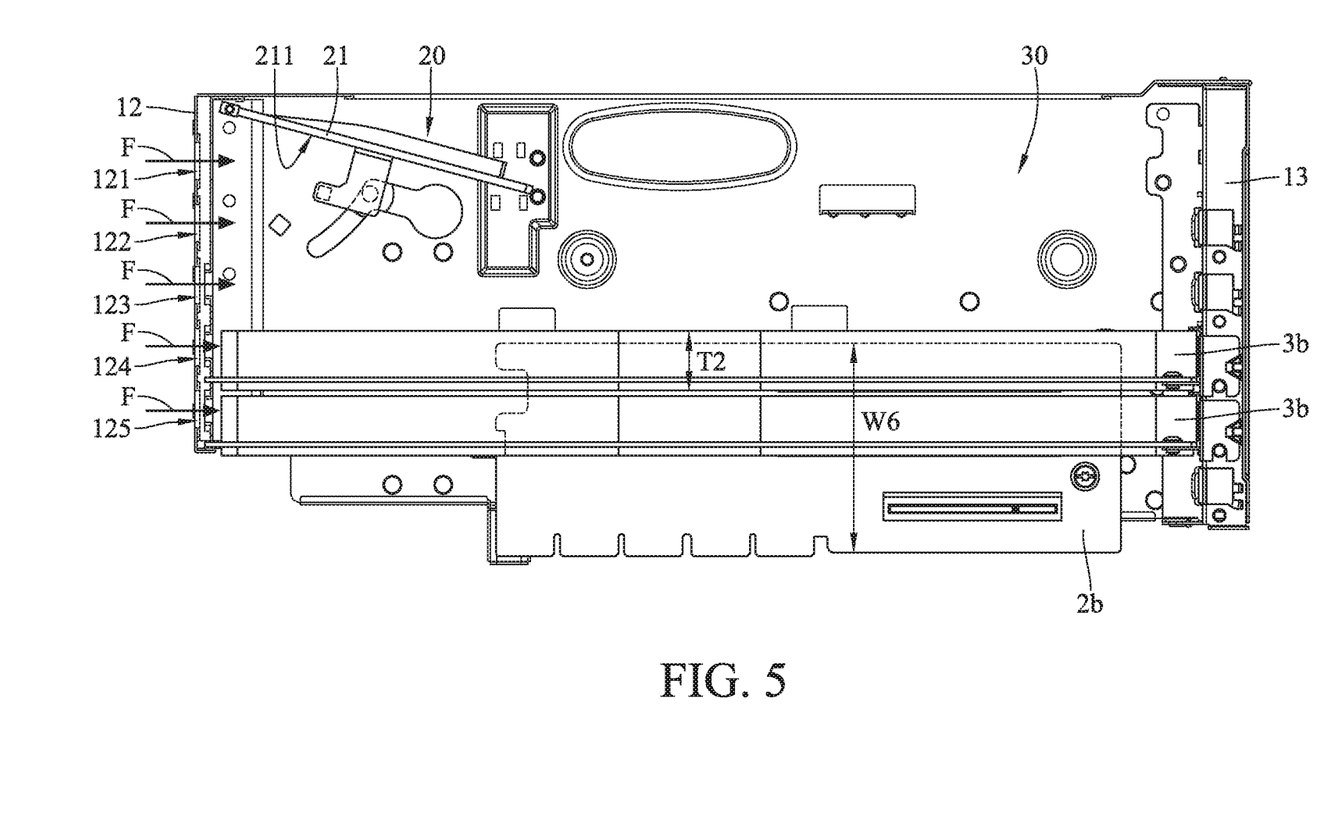
FIG. 5 is a top view of the cage assembly in FIG. 1 when the cage assembly accommodates another riser card and expansion cards.
Figure 6:
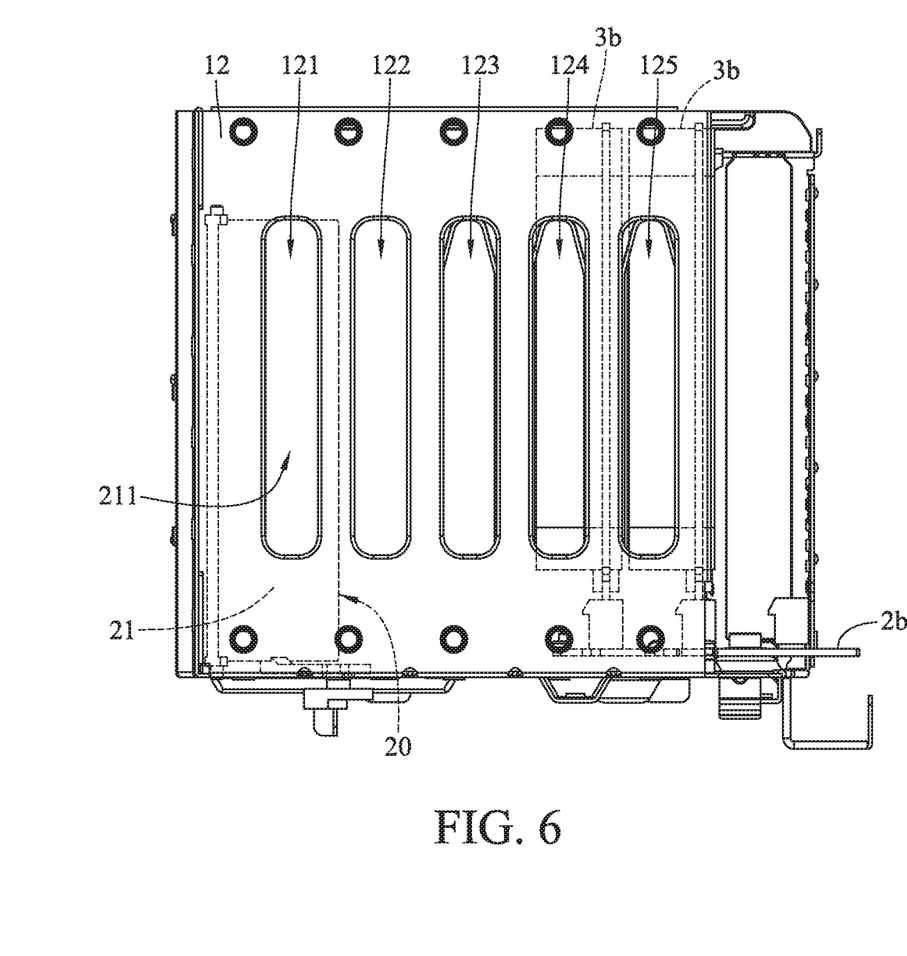
FIG. 6 is a side view of the cage assembly in FIG. 5.

Then, referring to FIGS. 5 and 6, FIG. 5 is a top view of the cage assembly 1 in FIG. 1 when the cage assembly 1 accommodates another riser card 2b and expansion cards 3b, and FIG. 6 is a side view of the cage assembly 1 in FIG. 5.

Then, please see FIG. 3 and further see FIGS. 5 and 6, the cage assembly 1 accommodates expansion cards 3b and a riser card 2b that are in different size from that of the previous embodiments. As shown, a thickness T2 of the expansion card 3b is smaller than a thickness T1 of the expansion card 3a, and a width W6 of the riser card 2b is smaller than a width W5 of the riser card 2a. In the arrangement shown in FIG. 5, the vent holes 124 and 125 may respectively correspond to the expansion cards 3b, but the vent holes 122 and 123 do not correspond any expansion card, thus the airflow F passing through the vent holes 122 and 123 may have no contribution on the heat dissipation to the expansion cards 3b.

To avoid this problem, the baffle 20 can be switched a proper position. Please see FIGS. 7 to 9, where FIG. 7 is a top view of the cage assembly 1 in FIG. 5 when the neck portion 23 of the baffle 20 is located at the first end 1111 of the guide hole 111, FIG. 8 is a top view of the cage assembly in FIG. 5 when the engaging portion 24 of the baffle 20 is located at the positioning hole 112, and FIG. 9 is a side view of the cage assembly 1 in FIG. 7.

Figure 7:
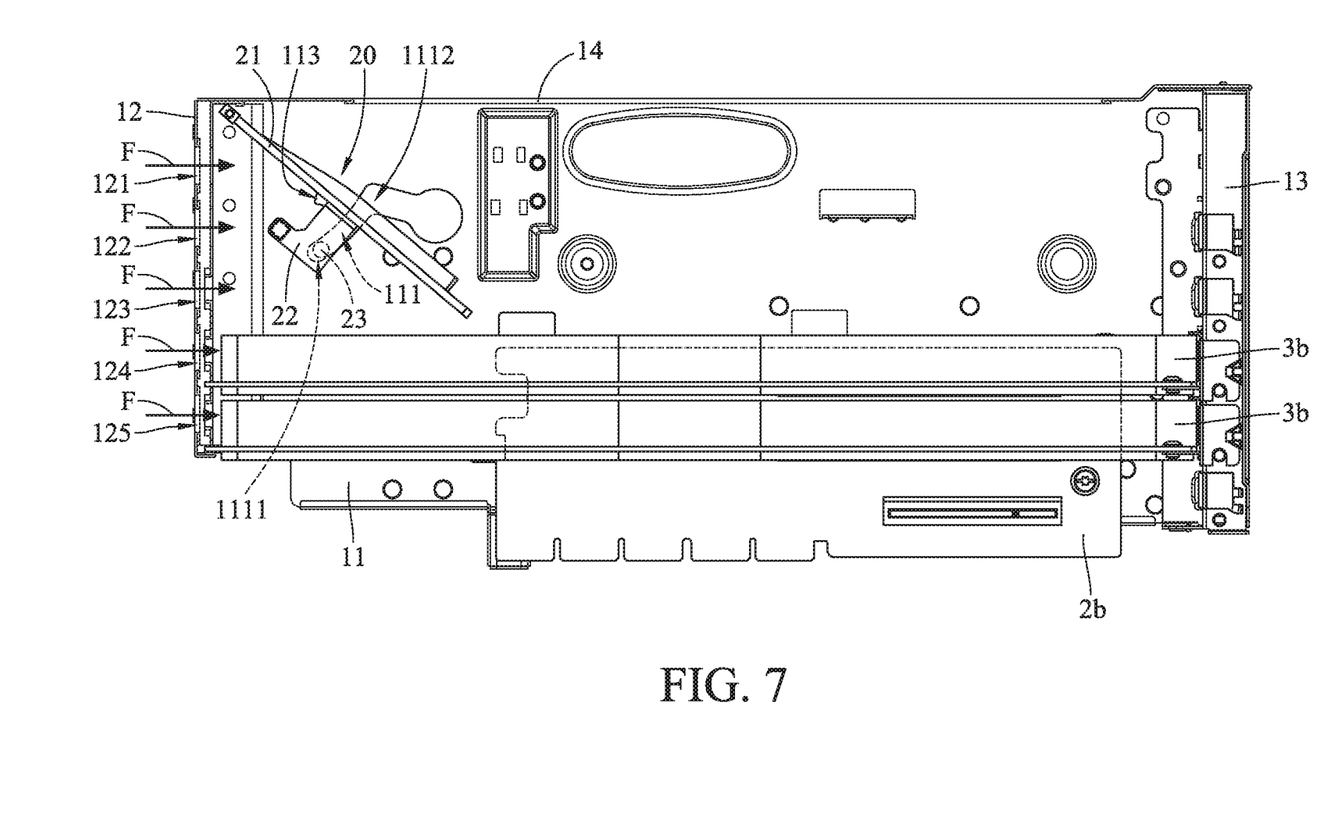
FIG. 7 is a top view of the cage assembly in FIG. 5 when a neck portion of a baffle is located at a second end of a guide hole.
Figure 8:
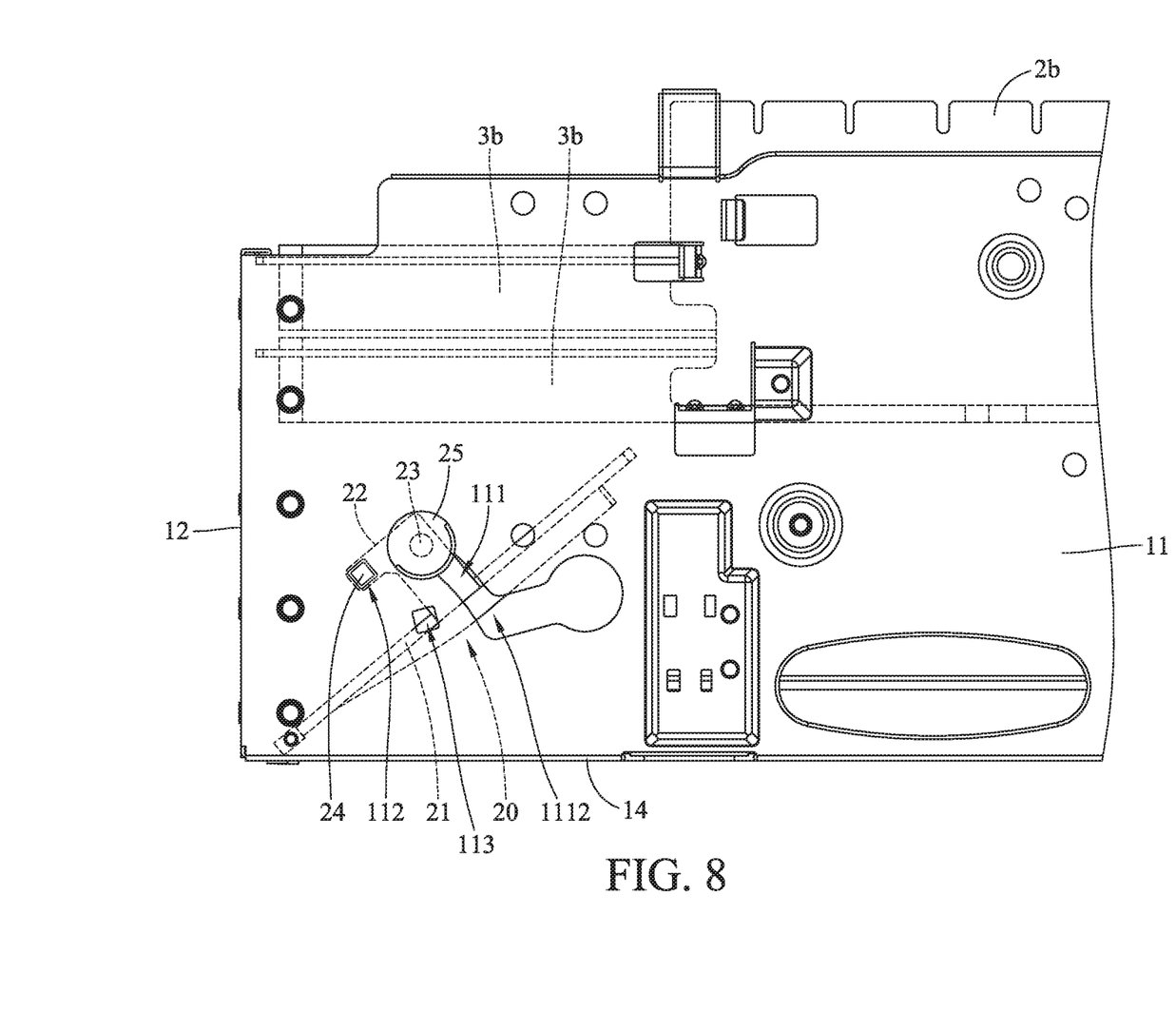
FIG. 8 is a top view of the cage assembly in FIG. 5 when an engaging portion of the baffle is located at another positioning hole.

As shown in FIGS. 7 and 8, the operative portion 25 of the baffle 20 can be forced to move closer to the rear portion 11 to deform the elastic extension portion 22 and disengage the engaging portion 24 from the positioning hole 113. Then, the operative portion 25 and the neck portion 23 can be moved to the first end 1111 of the guide hole 111 so as to pivot the plate portion 21 to move closer to the first plate portion 12. Then, the operative portion 25 can be released so that the elastic extension portion 22 returns to its original shape to engage the engaging portion 24 into the positioning hole 112. At this moment, the baffle 20 is fixed in the current position.

Figure 9:
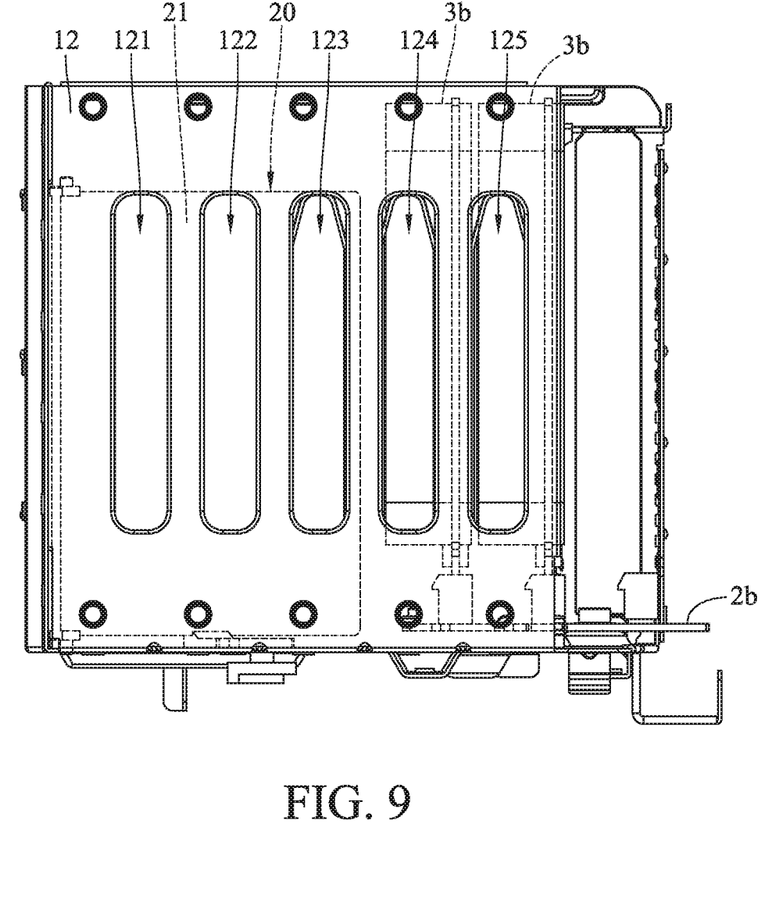
FIG. 9 is a side view of the cage assembly in FIG. 7.

As shown in FIG. 9, during the above pivot movement of the baffle 20 towards the first plate portion 12, the area of an orthogonal projection of the baffle 20 projected on the vent holes of the first plate portion 12 gradually increases. In detail, as shown in FIG. 6, only the vent hole 121 corresponds to the plate portion 21 of the baffle 20; as shown in FIG. 9, the angled baffle 20 can at least correspond to the vent holes 121, 122 and 123. As a result, the airflow F flowing through all of the vent holes 121, 122, 123, 124 and 125 can be guided towards the area for the expansion cards 3b so as to ensure effective use of the airflow F for dissipating heat generated by the expansion cards 3b.

On the other hand, when adopting a large-sized expansion cards (e.g., the expansion cards 3a), the baffle 20 can be pivoted towards the third plate portion 14, such that the baffle 20 not only can be pivoted to make the best use of the airflow F for dissipating heat generated by the expansion cards, but also can avoid having structural interference with the large-sized expansion cards.

In this embodiment, the baffle 20 is pivotable with respect to the cage body 10 to adjust the area of the orthogonal projection of the plate portion 21 of the baffle 20 projected on the vent holes of the first plate portion 12; that is, the amount of the vent holes that the baffle 20 corresponds can be adjusted, such that the gap between the baffle 20 and the expansion cards can be adjusted by switching the angle of the baffle 20. As such, regardless of the overall size of the expansion cards, the airflow F flowing through all of the vent holes 121, 121, 122, 123, 124 and 125 all can be effectively guided towards the area for the expansion cards by switching angles of the baffle 20, which means that the baffle 20 can switch its angles to make the best use of the airflow F flowing through the vent holes 121, 121, 122, 123, 124 and 125 according to the overall size of the expansion cards while having no structural interference with the expansion cards. In short, the single baffle 20 of the cage assembly 1 of the disclosure is suitable for different sized expansion cards. Therefore, there is no need to replace the baffle 20 when adopting one or more different-sized expansion cards.

Note that the quantity of the vent holes of the first plate portion may be modified as desired. In some other embodiments, the quantity of the vent holes on the first plate portion may be more than or less than five.

In this embodiment, the cooperation of the positioning holes 112 and 113 and the engaging portion 24 of the baffle 20 can fix the baffle 20 in position and thus preventing the baffle 20 from being unwantedly pivoted and reducing the efficiency of the airflow F. However, the quantity of the positioning holes 112 and 113 may be modified; in some other embodiment, the rear portion may have more than or less than two positioning holes. In a case without any positioning hole, the baffle may not include the second extension plate, the engaging portion, the first extension plate and the operative portion, and the neck portion of the baffle may be directly connected to the plate portion of the baffle.

Furthermore, the connecting hole 114 and the insertion hole 115 are located farther away from the axis P of the plate portion 21 than the guide hole 111, such that the operative portion 25 will not be moved to the insertion hole 115 during the pivot movement of the baffle 20, thus the baffle 20 is prevented from being accidentally detached from the rear portion 11 of the cage body 10.

Moreover, the width W1 of the operative portion 25 of the baffle 20 is larger than the width W3 of the guide hole 111 of the rear portion 11, such that the movement of the operative portion 25 can be limited by the rear portion 11 of the cage body 10. Therefore, no matter how hard the operative portion 25 is pressed, the operative portion 25 is still located at the side of the rear portion 11 of the cage body 10 facing away from the accommodation space 30, thus it prevents the baffle 20 from being detached from the rear portion 11.

In the aforementioned discussions, the quantity of the expansion cards mounted on the riser card is exemplary and not intended to limit the present disclosure. In some other embodiments, the riser card may be connected with one or more than two expansion cards, and the angle of the baffle can be adjusted accordingly.

According to the cage assemblies as discussed above, the baffle is pivotable with respect to the cage body to adjust the area of the orthogonal projection of the plate portion of the baffle projected on the vent holes of the first plate portion, such that the airflow flowing through all of the vent holes all can be effectively guided towards the area for the expansion cards by switching angles of the baffle. Therefore, the single baffle of the cage assembly of the disclosure is suitable for different-sized expansion cards, thus there is no need to replace the baffle when adopting one or more different-sized expansion cards.

In addition, the cooperation of the positioning holes and the engaging portion can fix the baffle in position and thus ensuring the required air-guiding effect of the baffle.

Furthermore, the connecting hole and the insertion hole are located farther away from the axis of the plate portion than the guide hole, such that the operative portion will not be moved to the insertion hole during the pivot movement of the baffle, thus the baffle is prevented from being accidentally detached from the rear portion of the cage body.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A cage assembly, configured to accommodate a riser card and an expansion card mounted on the riser card, comprising:
    a cage body, comprising a rear portion, a first plate portion, a second plate portion, and a third plate portion, wherein the first plate portion, the second plate portion and the third plate portion are respectively connected to different sides of the rear portion, the first plate portion and the second plate portion are respectively located at two opposite sides of the rear portion, the third plate portion is located between and connected to the first plate portion and the second plate portion, the rear portion, the first plate portion, the second plate portion and the third plate portion together form an accommodation space therebetween, the accommodation space is configured to accommodate the riser card and the expansion card, and the first plate portion comprises a vent hole connected to the accommodation space; and
    a baffle, located in the accommodation space and pivotably disposed on the cage body;
    wherein the baffle is configured to be pivoted with respect to the cage body so as to adjust an area of an orthogonal projection of the baffle projected on the vent hole;
    wherein the rear portion comprises a guide hole connected to the accommodation space, the guide hole comprises a first end and a second end opposite to each other, the first end of the guide hole is located closer to the first plate portion than the second end of the guide hole, the second end of the guide hole is located close to the third plate portion than the first end of the guide hole, the baffle comprises a plate portion and a neck portion connected to each other, the plate portion is located in the accommodation space and is pivotably disposed on the cage body, and the neck portion is movably located at the guide hole.

2. The cage assembly according to claim 1, wherein the baffle further comprises an elastic extension portion and an engaging portion, the elastic extension portion is located in the accommodation space and connected to a side of the plate portion close to the rear portion, the engaging portion and the neck portion are connected to a surface of the elastic extension portion facing the rear portion, a distance between the engaging portion and an axis of the baffle is different from a distance between the neck portion and the axis of the baffle, the rear portion further comprises two positioning holes connected to the accommodation space, the two positioning holes are arranged along a curve line, the axis of the baffle is the center of the curved line, the engaging portion is detachably engaged with one of the positioning holes.

3. The cage assembly according to claim 2, wherein the plate portion comprises a flow-guiding surface facing to first plate portion, the elastic extension portion comprises a first extension plate and a second extension plate, the first extension plate is connected to the side of the plate portion close to the rear portion and extends along a normal line of the flow-guiding surface, the second extension plate is connected to the rear portion via the first extension plate and extends along a direction perpendicular to the normal line of the flow-guiding surface, the engaging portion is connected to the second extension plate, and the neck portion is connected to the first extension plate.

4. The cage assembly according to claim 2, wherein the two positioning hole are located closer to the axis of the baffle than the guide hole, and the engaging portion is located closer to the axis of the baffle than the neck portion.

5. The cage assembly according to claim 2, wherein the baffle further comprises a operative portion, the operative portion is located at a side of the rear portion facing away from the accommodation space, the operative portion is connected to the elastic extension portion via the neck portion, the operative portion is movable with respect to the rear portion via the elastic extension portion so as to engage the engaging portion with one of the positioning holes or detach the engaging portion from one of the positioning holes.

6. The cage assembly according to claim 5, wherein the operative portion is wider than the neck portion and the guide hole.

7. The cage assembly according to claim 6, wherein the rear portion further comprises a connecting hole and an insertion hole, the insertion hole is connected to the guide hole via the connecting hole, the insertion hole is wider than the connecting hole and the guide hole, the operative portion is narrower than the insertion hole and wider than the connecting hole, and the neck portion is narrower than the connecting hole.

8. The cage assembly according to claim 7, wherein the connecting hole is connected to the second end of the guide hole.

9. The cage assembly according to claim 7, wherein the connecting hole and the insertion hole are farther away from the axis of the baffle than the guide hole.

* * * * *